United States Patent
Reeves et al.

(10) Patent No.: US 12,203,192 B2
(45) Date of Patent: Jan. 21, 2025

(54) METHOD OF OPTIMIZING THE EMI SHIELDING AND INFRARED TRANSPARENCY OF GAAS IR WINDOWS

(71) Applicant: BAE SYSTEMS Information and Electronic Systems Integration Inc., Nashua, NH (US)

(72) Inventors: Jeremy B. Reeves, Chelmsford, MA (US); Kevin T. Zawilski, Arlington, MA (US); Peter G. Schunemann, Hollis, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 10 days.

(21) Appl. No.: 18/072,931

(22) Filed: Dec. 1, 2022

(65) Prior Publication Data

US 2024/0183066 A1    Jun. 6, 2024

(51) Int. Cl.
| | |
|---|---|
| *C30B 25/20* | (2006.01) |
| *C09D 5/00* | (2006.01) |
| *C30B 25/16* | (2006.01) |
| *C30B 29/42* | (2006.01) |
| *H05K 9/00* | (2006.01) |

(52) U.S. Cl.
CPC .............. *C30B 25/20* (2013.01); *C09D 5/006* (2013.01); *C30B 25/16* (2013.01); *C30B 29/42* (2013.01); *H05K 9/0005* (2013.01); *H05K 9/0094* (2013.01)

(58) Field of Classification Search
CPC ......... C30B 25/20; C30B 25/16; C30B 29/42; C30B 29/44; C09D 5/006; H05K 9/0005; H05K 9/0094
See application file for complete search history.

(56) References Cited

U.S. PATENT DOCUMENTS

| | | |
|---|---|---|
| 3,944,393 A | 3/1976 | Schierding |
| 4,778,731 A | 10/1988 | Kraatz |
| (Continued) | | |

OTHER PUBLICATIONS

Office Action for U.S. Appl. No. 18/073,179 mail date Sep. 10, 2024, 16 pages.

(Continued)

*Primary Examiner* — Michael G Miller
(74) *Attorney, Agent, or Firm* — Maine Cernota & Curran; Gary McFaline (57) ABSTRACT

A method of manufacturing a structurally competent, EMI-shielded IR window includes using a mathematical model that combines the Sotoodeh and Nag models to determine an optimal thickness and dopant concentration of a doped layer of GaAs or GaP. A slab of GaAs or GaP is prepared, and a doped layer of the same material having the optimal thickness and dopant concentration is applied thereto. In embodiments, the doped layer is applied by an HVPE method such as LP-HVPE, which can also provide enhanced GaAs transparency near 1 micron. The Drude model can be applied to assist in selecting an anti-reflective coating. If the model predicts that the requirements of an application cannot be met by a doped layer alone, a doped layer can be applied that exceeds the required IR transparency, and a metallic grid can be applied to improve the EMI shielding, thereby satisfying the requirements.

10 Claims, 5 Drawing Sheets

(56) References Cited

U.S. PATENT DOCUMENTS

| | | | |
|---|---|---|---|
| 4,939,043 A | | 7/1990 | Biricik |
| 5,007,979 A | | 4/1991 | Mizuniwa |
| 5,173,443 A | * | 12/1992 | Biricik .................... G02B 1/10 |
| | | | 148/DIG. 80 |
| 5,824,418 A | | 10/1998 | Tully |
| 10,156,023 B2 | | 12/2018 | Schunemann |
| 2003/0172870 A1 | | 9/2003 | Liu |
| 2010/0219509 A1 | | 9/2010 | He |
| 2011/0256693 A1 | | 10/2011 | D'Evelyn |
| 2012/0031324 A1 | | 2/2012 | Hiromura |
| 2012/0097092 A1 | | 4/2012 | Zhu |
| 2012/0255484 A1 | | 10/2012 | Zhu |
| 2014/0162441 A1 | | 6/2014 | Preble |
| 2017/0362739 A1 | | 12/2017 | Kajimoto |

OTHER PUBLICATIONS

Notice of Allowance for U.S. Appl. No. 18/073,228 mail date Sep. 30, 2024, 15 pages.

Sotoodeh, M., A. H. Khalid, and A. A. Rezazadeh. "Empirical low-field mobility model for III-V compounds applicable in device simulation codes." Journal of applied physics 87.6 dated Mar. 15, 2000): 2890-2900.

Strömberg, A., Bhargava, P., Xu, Z., Lourdudoss, S. and Sun, Y. (2021), Direct Heteroepitaxy and Selective Area Growth of GaP and GaAs on Si by Hydride Vapor Phase Epitaxy. Phys. Status Solidi A, dated Oct. 17, 2020 218.3.

Peter G. Schunemann et al., Method of Producing Large GaAs and GaP Infrared Windows, patent application, filed Dec. 1, 2022, U.S. Appl. No. 18/073,177.

Peter G. Schunemann et al., Method of Producing Large EMI Shielded GaAs Infrared Windows, patent application, filed Dec. 1, 2022, U.S. Appl. No. 18/073,179.

Peter G. Schunemann et al., Method of Producing Large EMI Shielded GaAs and GaP Infrared Windows, patent application, filed Dec. 1, 2022, U.S. Appl. No. 18/073,183.

Peter G. Schunemann et al., Method of Producing Large GaAs and GaP Infrared Windows, patent application, filed Dec. 1, 2022, U.S. Appl. No. 18/073,228.

* cited by examiner

METHOD OF OPTIMIZING THE EMI SHIELDING AND INFRARED TRANSPARENCY OF GAAS IR WINDOWS

RELATED APPLICATIONS

This application is related to co-pending U.S. application Ser. No. 18/073,177 entitled METHOD OF PRODUCING LARGE GaAs AND GaP INFRARED WINDOWS with first inventor Peter G. Schunemann, filed on Dec. 1, 2022, U.S. application Ser. No. 18/073,228 entitled METHOD OF PRODUCING LARGE GaAs AND GaP INFRARED WINDOWS with first inventor Peter G. Schunemann, filed on Dec. 1, 2022, U.S. application Ser. No. 18/073,179 entitled METHOD OF PRODUCING LARGE EMI SHIELDED GaAs INFRARED WINDOWS with first inventor Peter G. Schunemann, filed on Dec. 1, 2022, and U.S. application Ser. No. 18/073,183 entitled METHOD OF PRODUCING LARGE EMI SHIELDED GaAs AND GaP INFRARED WINDOWS with first inventor Peter G. Schunemann, filed on Dec. 1, 2022, all of which are also by the present Applicant, all of which are herein incorporated by reference in their entirety for all purposes.

FIELD

The disclosure relates to optical windows, and more particularly, to EMI shielded windows that are transparent at infrared wavelengths.

BACKGROUND

A growing number of optical systems incorporate infrared (IR) sensors and/or lasers that operate over a wide range of wavelengths between one and twelve microns. Accordingly, the platforms on which these devices are mounted require optical windows that are highly transparent over this broad spectral range.

Furthermore, as electronics and sensor systems become more highly and densely integrated, the need has increased for electromagnetic shielding (EMI) of components. For systems that require optical windows, it has therefore become increasingly necessary to provide EMI shielded IR windows, i.e. windows that have very low absorption at IR wavelengths of interest, while also shielding the window aperture against electromagnetic penetration.

Designing an EMI-shielding IR window includes at least two fundamental steps: 1) selecting a "slab" material that will be sufficiently transparent over the wavelengths of interest, and can be manufactured in a size that is sufficiently large and strong to suit the desired application (structural competence), and 2) selecting a type of conductive layer that can be applied to the slab to provide EMI shielding.

Most candidate materials for IR transparent window slabs are crystalline or polycrystalline semiconductors, such as Si, Ge, ZnSe, ZnS, GaAs, and GaP. Polycrystalline Si and single crystal Czochralski-grown (Cz) Si are widely available in various form factors, but suffer from absorption due to interstitial oxygen at 9 µm. Float zone (FZ) growth of Si can mitigate the oxygen impurities that are responsible for strong absorption peaks at 5.8 µm and 9 µm. However, silicon slabs manufactured by any means are plagued by numerous intrinsic multi-phonon absorption peaks that dominate the longwave spectrum. Ge slabs are also subject to similar disadvantages.

GaAs has good transparency between 2 and 12 microns, and good structural characteristics, while being free from the absorption problems that limit Ge and Si. Furthermore, single crystal GaAs boules grown from melt are available up to 8" in diameter, from which window slabs can be conveniently sliced. However, scaling commercial state-of-the-art GaAs boules would be extremely costly, and hindered by ever-increasing heat-removal problems at larger and larger diameters. In addition, GaAs windows that are produced in this manner have significant IR absorption bands, especially near 1 micron, due to so-called "EL2" defects that arise from excess arsenic atoms being incorporated on gallium sites in the crystal lattice. GaP is also highly transparent to IR, especially at wavelengths of 8 microns and shorter. However, GaP has not been a practical choice for larger windows, because GaP boules are limited to only about 3" in diameter, and even those are not readily available.

Chemical vapor deposition (CVD) grown polycrystalline zinc selenide has an extremely wide transmission range from 0.5 to 15 µm. However, its intrinsic hardness and flexural strength is extremely low, rendering it unsuitable for larger IR windows. Instead, hot-isostatic-pressed (HIP) polycrystalline Zinc Sulfide (ZnS) represents the current state of the art for large aperture infrared (IR) window materials, due to its broad spectral transparency and adequate mechanical properties. HIP ZnS is generally produced by first growing crystalline ZnS by CVD, and then applying the additional step of HIP, which of course adds to the cost of the final product.

One approach to applying a thin conductive layer to an IR window slab is to apply a thin coating of a doped semiconductor to the slab, for example using a vacuum deposition technique. Of course, this approach requires that the coating material is compatible with the crystal structure of the underlying slab, and that an appropriate deposition process is available for applying the conductive coating. If the slab material is a semiconductor, then in many cases the same material can be doped and applied as the conductive coating.

In general, such thin conductive coatings are very heavily doped amorphous semiconductors, which tend to exhibit high infrared absorption due to free carrier absorption. This leads to a trade-off between optical transparency and EMI shielding efficacy. Indeed, if the IR transparency and EMI conductivity requirements for a given application are especially demanding, it may not be possible for a doped semiconductor layer to satisfy both requirements. Furthermore, the conductivity and optical transparency of doped semiconductor layers can be difficult to accurately model, such that time consuming and expensive trial-and-error may be needed before it is known whether a doped semiconductor layer can meet the specified requirements and, if so, what will be the best combination of layer thickness and dopant level.

Furthermore, it is nearly impossible to dope ZnS to produce a conductive EMI layer, due to its low carrier mobility, and due to its tendency to form compensating defects that neutralize dopants to maintain their insulating properties. This problem can be circumvented by preparing a separate, thin wafer of a doped semiconductor such as GaAs, and then attaching the wafer to the surface of a ZnS window by optical bonding. However, the difference in refractive index between ZnS and GaAs will result in severe reflection losses at the interface between the two materials, making the transparency impractically low. also, this approach suffers from the same transparency/shielding tradeoff, and the same modeling difficulties, that apply to vacuum deposited doped semiconductor layers.

Instead, when EMI shielding is required, ZnS windows generally rely on metallic grid coatings deposited on the window surface. However, the metal lines in the grid coating are opaque to nearly all forms of EM radiation, including IR radiation, causing portions of the window to be obscured. A metallic grid can also significantly reduce the optical transmission of the window, especially at large angles of incidence. Additionally, the grid pattern can lead to diffraction of IR waves passing through the material, which can have substantial negative impacts on system performance.

What is needed, therefore, is a method of manufacturing an IR window that is transparent over a wide range of IR wavelengths, and to which EMI-shielding is applied with minimal optical artifacts and loss of transparency, and without requiring unduly complex and costly processing steps.

SUMMARY

The present disclosure is a method of manufacturing an IR window that is transparent over a wide range of IR wavelengths, and to which EMI-shielding is applied with minimal optical artifacts and loss of transparency and without requiring unduly complex and costly processing steps.

More specifically, the present disclosure is a method of manufacturing single crystalline semiconductor windows, such as GaAs and GaP windows, to which a doped layer of the same material is applied for EMI shielding. The disclosure includes a method of accurately modeling the IR transparency and conductivity of the EMI shielding layer as a function of layer thickness and dopant concentration, thereby determining whether the requirements of a specific application can be met by a doped conductive layer, and if so, what will be the optimal thickness and dopant concentration of the layer.

For GaAs windows, the present disclosure further provides a method of extending the transparency of the slab material by growing the single crystal GaAs slab using hydride vapor phase epitaxy (HVPE) rather than by vertical melt growth, and thereby significantly improving the IR transparency of the GaAs, especially at wavelengths near 1 micron.

HVPE-grown GaAs windows exhibit lower absorption than melt-grown "commercial off-the-shelf" (COTS) crystals in part because GaAs grown using HVPE exhibits a greatly reduced concentration of impurities due to the use of ultra-high purity gas phase precursors. More importantly, native defects are reduced because the reduced growth temperatures of HVPE limit the solubility of excess arsenic that manifests itself as arsenic-on-gallium anti-sites. It is these so-called "EL2" defects that tend to cause high absorption losses in conventional, melt-grown GaAs windows at wavelengths near one micron. In embodiments, the GaAs slab is grown using low-pressure HVPE (LP-HVPE) to obtain a maximum growth rate that can be comparable to the growth rates of GaAs boules.

Embodiments further include applying an anti-reflective (AR) coating. In some of these embodiments, a Drude free electron model of conductivity is used to estimate the real part of the index of refraction of the doped GaAs or GaP layer, thereby providing a starting point for designing an efficient AR coating.

In embodiments, if the disclosed model predicts that the required combination of IR transparency and EMI shielding cannot be met by a doped layer alone, the method further includes applying a metallic grid coating to the slab in addition to the doped semiconductor layer. Due to the inverse dependence of skin depth on conductivity, the EMI shielding provided by a doped semiconductor layer will be weakest at the lower end of the EMI frequency range. In contrast, for a metallic grid having a given grid spacing, the EMI shielding will be strongest at the lower end of the EMI frequency range. Accordingly, for embodiments that include a metallic grid layer in addition to the doped semiconductor layer, the metallic grid is significantly thinner and more widely spaced than would be required if the EMI shielding depended entirely on the metallic grid. Any loss of transparency and optical artifacts introduced by the metallic grid are thereby minimized.

A first general aspect of the present disclosure is an EMI shielded infrared (IR) window comprising a slab of GaAs or GaP, and a doped layer of the respective GaAs or GaP comprising a dopant that causes the doped layer to reduce EMI transmission therethrough, said doped layer having a layer thickness and dopant concentration that are configured to satisfy a required transparency and EMI shielding. The dopant concentration is based on applying a low field mobility model to estimate a carrier mobility from the dopant concentration and according to the estimated carrier mobility, calculating a sheet resistance, and the infrared transparency is predicted as a function of an infrared wavelength and the sheet resistance using a quantum mechanical defect scattering Nag model.

Embodiments further include a metallic grid layer applied to the infrared window.

Any of the above embodiments can further include an anti-reflective (AR) coating applied to the doped layer.

A second general aspect of the present disclosure is a method of designing and manufacturing an EMI shielded infrared (IR) window suitable for a specified application having specified size, transparency, and EMI shielding requirements. The method includes preparing a slab of GaAs or GaP according to the size requirement of the specified application, the slab having sufficient thickness to meet a structural competence requirement of the specified application, selecting a plurality of candidate parameter combinations comprising combinations of candidate dopant concentrations and candidate layer thicknesses for a doped conductive layer to be applied to the slab, the doped layer being a doped layer of GaAs if the slab is a GaAs slab, the doped layer being a doped layer of GaP if the slab is a GaP slab, and applying a model to the candidate parameter combinations, thereby for each of the candidate parameter combinations estimating an IR absorption and a sheet conductivity of the doped conductive layer.

Applying the model comprises applying an empirical low field mobility model according to Sotoodeh, thereby estimating a carrier mobility of the doped conductive layer, calculating an estimated sheet resistance of the doped conductive layer according to the candidate parameters and the estimated carrier mobility, and applying a quantum mechanical defect scattering model of free carrier absorption based upon a relationship taught by Nag, thereby estimating the IR absorption of the doped conductive layer according to the candidate layer thickness and the estimated sheet resistance of the doped conductive layer, The method further comprises repeating the steps of selecting candidate parameters and applying the model thereto until an optimal combination of layer thickness and dopant concentration are determined, and if the model predicts that applying the doped semiconductor layer having the determined optimal combination of layer thickness and dopant concentration will meet the transparency and EMI shielding requirements of the specified application, applying the doped conductive layer to the slab according to the determined optimal combination of layer thickness and dopant concentration.

In embodiments, the doped conductive layer is applied to the slab by a vacuum deposition process.

In any of the above embodiments, the doped conductive layer can be applied to the slab by hydride vapor phase epitaxy (HVPE) or by low pressure HVPE (LP-HVPE).

Any of the above embodiments can further include applying an anti-reflective (AR) coating onto the doped conductive layer. In some of these embodiments the method further comprises applying a Drude model to estimate a real part of an index of refraction of the doped conductive layer, and selecting the AR coating at least in part according to the estimated real part of the index of refraction of the doped conductive layer.

In any of the above embodiments, the slab can be a GaAs slab, and preparing the slab can include growing the GaAs slab using HPVE. In some of these embodiments preparing the slab includes growing the GaAs slab using LP-HPVE. In any of these embodiments, the doped conductive layer can be applied to the slab as part of the HVPE process that is used to grow the slab.

In any of the above embodiments, the method can further include, if the model predicts that applying the doped semiconductor layer having the determined optimal combination of layer thickness and dopant concentration will not meet the transparency and EMI shielding requirements of the specified application. applying the doped conductive layer to the slab with a combination of layer thickness and dopant concentration that exceeds the transparency requirement of the application, and applying a metallic grid to the slab having a thickness and grid spacing sufficient to cause the combined metallic grid and doped semiconductor EMI shielding to meet both of the transparency and EMI shielding requirements of the specified application.

A third general aspect of the present disclosure is a method of manufacturing an IR window, the method comprising growing a GaAs window slab using HVPE, wherein Ga and As gases used by the HVPE are sufficiently pure to increase the IR transmission of a 1 mm thick slab near a wavelength of 1 micron to more than 50%.

In embodiments, the slab is grown using LP-HVPE.

Any of the above embodiments can further include applying a conductive layer of doped GaAs to the slab, thereby providing EMI shielding to the slab. In some of these embodiments, the doped conductive layer is applied to the slab as part of the HVPE process that is used to grow the slab. Any of these embodiments can further include, if the doped GaAs layer cannot meet transparency and EMI shielding requirements of a specified application, applying a metallic grid to the GaAs slab having a thickness and grid spacing that are sufficient to cause the combined metallic grid and doped GaAs EMI shielding to meet both the transparency and EMI shielding requirements of the specified application.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present disclosure is a method of manufacturing an IR window that is transparent over a wide range of IR wavelengths, and to which EMI-shielding is applied with minimal optical artifacts and loss of transparency.

More specifically, the present disclosure is a method of manufacturing GaAs and GaP windows to which a doped layer of the same material is applied for EMI shielding.

As noted above, implementing a GaAs or GaP IR window that is EMI shielded by applying a doped semiconductor layer faces at least two obstacles. First, because of the trade-off between IR transparency and EMI shielding, it is necessary to determine whether a doped semiconductor layer applied to a GaAs or GaP slab will be able to satisfy both the transparency and the EMI shielding requirements of a given application. Second, due to the complex dependence of the sheet conductivity on both the dopant level and the layer thickness, it is necessary to determine the optimal combination of these two parameters for a given application.

The present disclosure overcomes both of these obstacles by accurately modeling the sheet conductivity and the IR transparency of a doped GaAs or GaP conductive layer as a function of the layer thickness and dopant level. By applying the model to a range of candidate layer thickness and dopant concentration values, it is possible to quickly determine the optimal combination of layer thickness and dopant concentration for a given application, and to determine whether these optimal thickness and dopant values will meet the requirements of the application. The desired window is then formed by applying a conductive layer, as determined using the model, to a GaAs or GaP slab, for example using an epitaxial method such as molecular beam epitaxy (MBE), metal-organic vapor phase epitaxy (MOVPE), metallo-organic chemical vapor deposition (MOCVD, organo-metallic vapor phase epitaxy (OMVPE), high vapor phase epitaxy (HVPE), or another vacuum deposition method.

The disclosed model begins by applying the "low field mobility model" as taught by Sotoodeh et. al. (M. Sotoodeh, A. H. Khalid, and A. A. Rezazadeh, Journal of Applied Physics 87, 2890 (2000); doi:10.1063/1.372274) to estimate the carrier mobility that will result from a given dopant concentration.

The empirical model estimates the low-field mobility ULF as a function of doping concentration N and temperature T according to the following empirical relationship:

$$\mu_{LF}(N, T) = \mu_{min} + \frac{\mu_{max}(300\ K)(300\ K/T)^{\theta_1} - \mu_{min}}{1 + \left(\frac{N}{N_{ref}(300\ K)(T/300\ K)^{\theta_2}}\right)^{\lambda}}$$

Where $\mu_{min}$, $\mu_{max}(300\ K)$, $N_{ref}(300\ K)$, $\lambda$, $\theta_1$, and $\theta_2$ are all fitted parameters.

According to the model, $\mu_{max}(T)$ is the low-field mobility at very low doping concentrations, $\mu_{min}$ is the low-field mobility at very high doping levels, and $N_{ref}(T)$ is the doing concentration at which the mobility reduces to almost half of its maximum value at low doping.

As reported by Sotoodeh et. al., for electrons in GaAs, the fitted parameters for GaAs are $\mu_{min}$=500 cm$^2$/V s, $\mu_{max}$(300 K)=9400 cm$^2$/V s, $N_{ref}$ (300 K)=6.0×10$^{16}$ cm$^{-3}$, $\lambda$=0.394, $\theta_1$=2.1, and $\theta_2$=3.0.

For holes in GaAs, the fitted parameters for GaAs are $\mu_{min}$=20 cm$^2$/V s, $\mu_{max}$(300 K)=491.5 cm$^2$/V s, $N_{ref}$(300 K)=1.48×10$^{17}$ cm$^{-3}$, $\lambda$=0.38, $\theta_1$=2.2, and $\theta_2$=3.0.

For electrons in GaP, the fitted parameters for GaAs are $\mu_{min}$=10 cm$^2$/V s, $\mu_{max}$(300 K)=152 cm$^2$/V s, $N_{ref}$(300 K)=4.4×10$^{18}$ cm$^{-3}$, $\lambda$=0.8, $\theta_1$=1.6, and $\theta_2$=0.71.

For holes in GaP, the fitted parameters for GaAs are $\mu_{min}$=10 cm$^2$/V s, $\mu_{max}$(300 K)=147 cm$^2$/V s, $N_{ref}$(300 K)=1.0×10$^{18}$ cm$^{-3}$, $\lambda$=0.85, $\theta_1$=1.98, and $\theta_2$=0.0.

Figure 1:
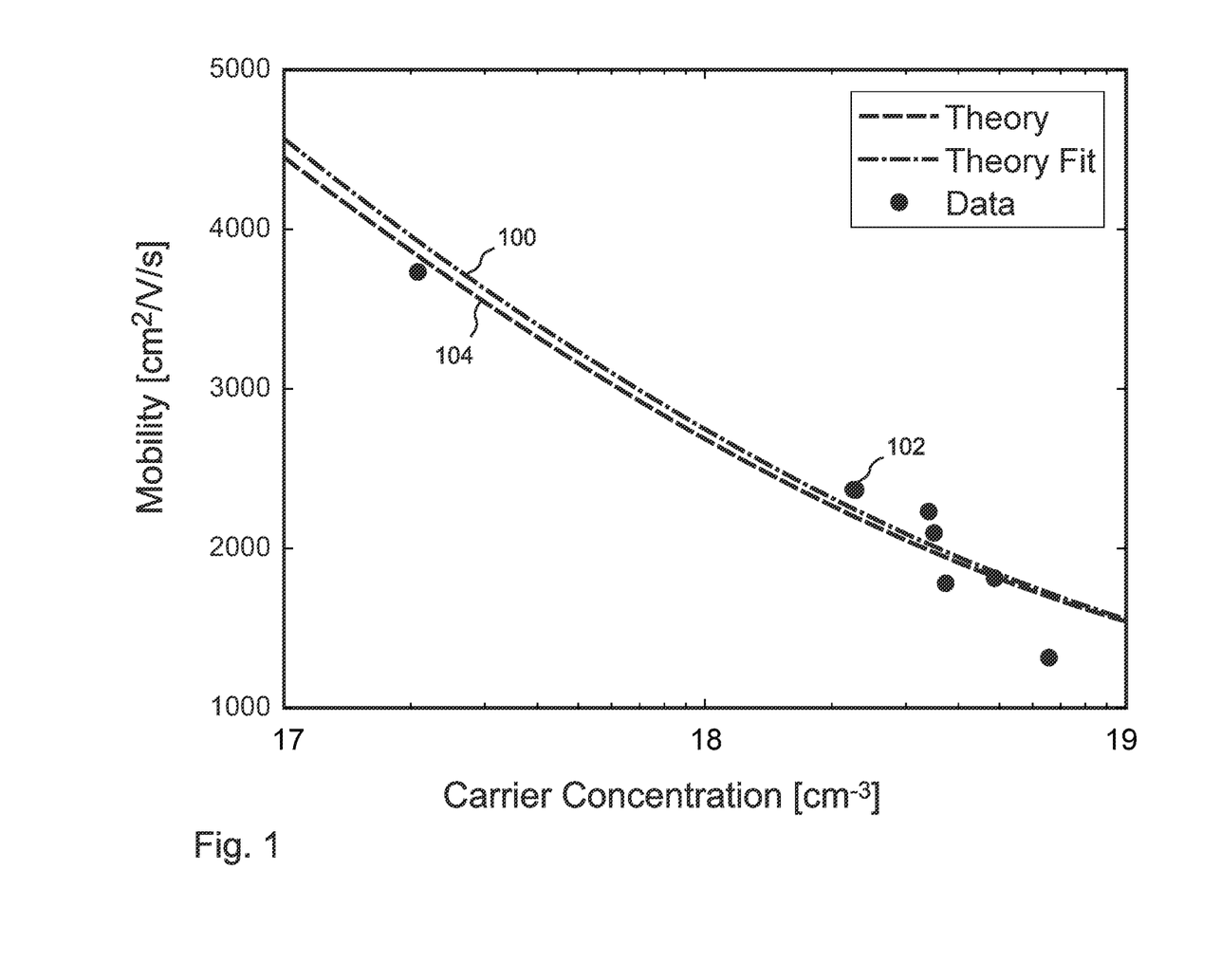
FIG. 1 is a graph presenting a comparison of measured values of carrier mobility for doped GaAs as a function of dopant concentration with predictions of the Sotoodeh model.

With reference to FIG. 1, the present inventors verified the accuracy of the Sotoodeh model by comparing the predictions 100 of the model (using the Sotoodeh fitted parameters given above) with currently measured data 102 for GaAs. For the measured results 102, the thickness of the sheet was measured to within 3% accuracy. It can be seen in the figure that that the least-squares fit 104 to the data agrees well with the model prediction 100.

Based on the predicted carrier mobility, the sheet resistance is then calculated according to $R_S = 1/tq\mu n$, where Rs is the sheet resistance, t is the thickness of the sheet, q is the electron charge, $\mu$ is the carrier mobility, and n is the carrier concentration.

The optical absorption of the doped layer is then predicted as a function of the IR wavelength and the sheet resistance using a quantum mechanical defect scattering model of free carrier absorption based upon a relationship taught by Nag (Nag, 1980) [B. R. Nag "Electron Transport in Compound Semiconductors" Springer-Verlag Berlin Heidleberg New York 1980, which is incorporated herein by reference for all purposes], especially chapter 9, table page 276. The "Nag" model provides expressions for five different scattering mechanisms by which IR photons are scattered by phonons or ionized impurities in a semiconductor. The scattering mechanisms and associated expressions for the absorption coefficient are as follows:

Deformation Potential Acoustic Phonon:

$$\alpha/n = \frac{2\sqrt{2}\,e^2 E_1^2 (m*k_B T)^{1/2} \sinh(\hbar\omega/2k_B T) K_2(\hbar\omega/2k_B T)}{3\pi^{3/2}\varepsilon_0 \hbar^3 \rho S^2 c n_r \omega}$$

Piezoelectric Acoustic Phonon:

$$\alpha/n = \frac{\sqrt{2}\,e^4 (h_{pz}^2/\varepsilon\rho s^2)(k_B T)^{1/2} \sin(\hbar\omega/2k_B T) K_1(\hbar\omega/2k_B T)}{3\pi^{3/2}\varepsilon_0 \varepsilon c n_r m^{*1/2} \omega^2 \hbar^2}$$

Ionized Impurity (Neglecting Screening):

$$\alpha/n = \frac{N_j Z^2 e^6 \sinh(\hbar\omega/2k_B T) K_0(\hbar\omega/2k_B T)}{3\sqrt{2}\,\pi^{3/2} \hbar\varepsilon^2 \varepsilon_0 c n_r m^{*3/2} \omega^3 (k_B T)^{1/2}}$$

Nonpolar Optic Phonon:

$$\alpha/n = \frac{2\sqrt{2}\,e^2 D_0^2 m^{*1/2}(k_B T)^{3/2} F_{op}(z, z_+, z_-)}{3\pi^{3/2}\varepsilon \hbar^4 \rho c n_r \omega_0 \omega^3}$$

Where $F_{op}(z, z_+, z_-) =$ $$[\sinh(z_+ - z)z_+^2 K_2(z_+) + \sinh(z_- + z)z_-^2 K_2(|z_-|)]/\sinh(z)$$

And $z = (\hbar\omega_0/2k_B T);\ z_+ = \dfrac{\hbar(\omega_0 + \omega)}{2k_B T};\ z_- = \dfrac{\hbar(\omega - \omega_0)}{2k_B T}$ Polar Optic Phonon:

$$\alpha/n = \frac{(K^{-1} - K_s^{-1})\sqrt{2}\,e^4 \hbar\omega_l (k_B T)^1 /2 F_{pop}(z, z_+, z_-)}{4\pi\varepsilon_0 3\pi^{1/2}\varepsilon_0 \hbar^3 \omega^3 c n_r m^{*1/2}}$$

Where $F_{pop}(z, z_+, z_-) =$ $$[\sinh(z_+ - z)z_+ K_1(z_+) + \sinh(z_- + z)K_1(|z_-|)]z_-/\sinh(z)$$

And $z = (\hbar\omega_l/2k_B T);\ z_+ = \dfrac{\hbar(\omega_l + \omega)}{2k_B T};\ z_- = \dfrac{\hbar(\omega - \omega_l)}{2k_B T}$ Variables in these equations are as follows:
α—absorption coefficient, defined as the ratio of the power absorbed per unit length of the sample to the incident power
m*—effective mass of the carriers (in this case electrons)
n—carrier density—measured for each sample after fabrication, or inferred from growth parameters
$E_1$—acoustic phonon deformation potential—taken from literature
ε—relative permittivity—taken from literature
$\varepsilon_0$—permittivity of free space—known physical constant
ρ—mass density—measured or known a priori
S—speed of sound in medium—taken from literature
C—speed of light in vacuum—known physical constant
$n_r$—refractive index—measured or taken from literature
$h_{pz}$—piezo electric constant—taken from literature
$K_1$, $K_2$—modified Bessel functions of the second kind first order and
second order respectively—known mathematical functions
K—dielectric constant—measured value taken from literature
$K_s$—static dielectric constant—measured value taken from literature
$N_j$—charged impurity number density—measured from growth process calibration
Z—charge of impurity—known value
$D_0$—nonpolar optical phonon deformation potential—taken from literature ω₀—optical phonon frequency—measured value taken from literature While the complete Nag model is presented above, the effects of the deformation potential acoustic phonon absorption and piezoelectric acoustic phonon absorption are expected to be negligible for GaAs and GaP. Because GaAs and GaP are both polar, it is expected that the polar optic phonon absorption will significant in both cases.

It is notable that many different models exist that attempt to predict carrier mobility, sheet resistance, and resulting IR absorption. In many cases, these models either require that specific parameters of the semiconductor be carefully measured, or simply fail to agree closely with measured results. While the models that are included in the present disclosure also require accurate measurements of several material parameters, as noted above, most of these can be found readily in published literature and need not be measured specifically for input into the model.

Figure 2:
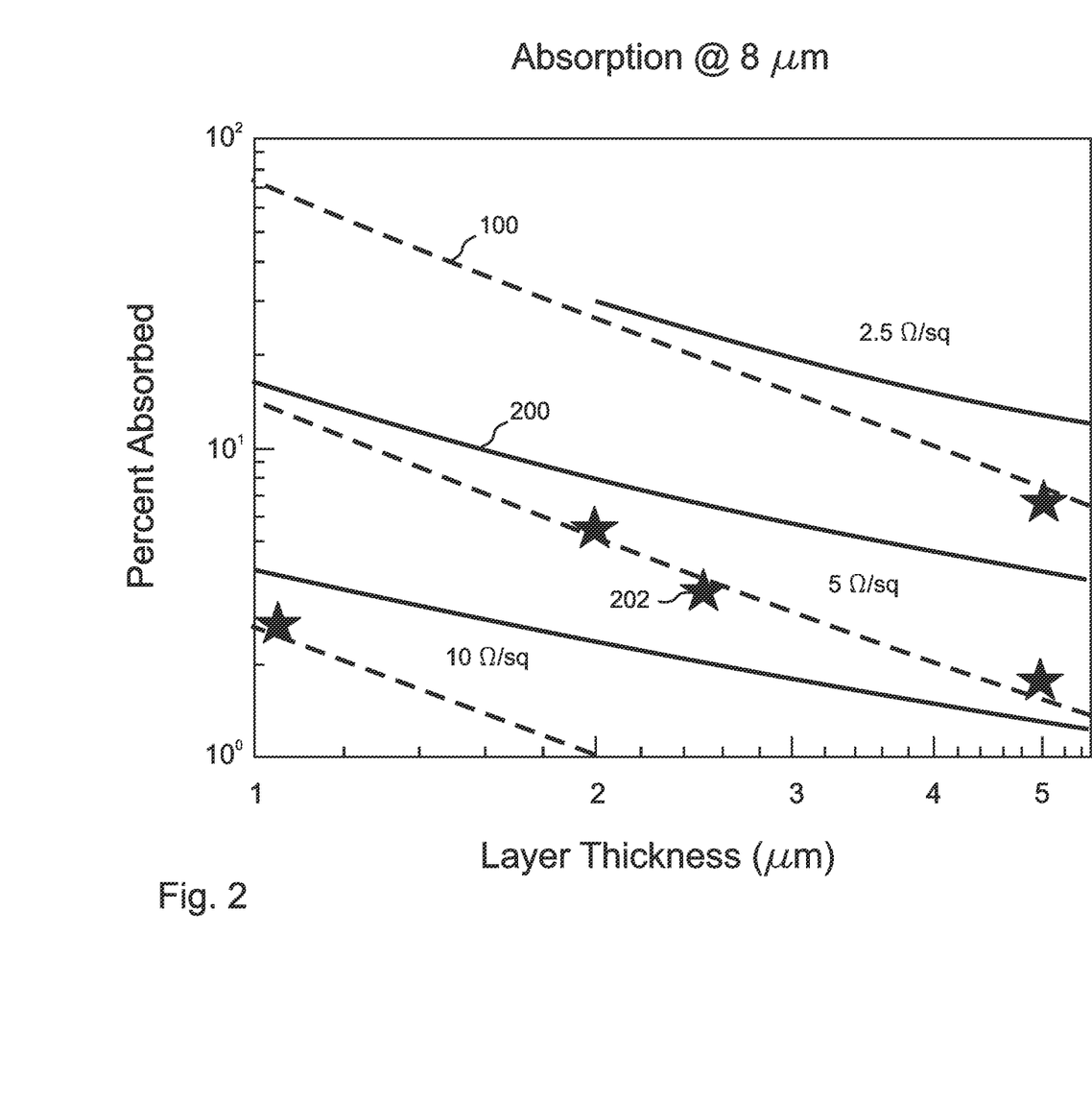
FIG. 2 is a graph presenting a comparison of measured values of absorption for doped GaAs as a function of layer thickness with predictions of the Drude and Nag models for several values of sheet resistance.

With reference to FIG. 2, the present inventors initially attempted to apply the Drude model 200 to predict IR absorption as a function of sheet resistance. The Drude model describes electrons as moving freely about a material until they are scattered by the lattice or by a defect. The probability of scattering is the same for all electrons and independent of the scattering mechanism and electron energy.

To fully describe a material in the Drude model, the characteristic scattering time $\tau$, the free carrier concentration N, the effective mass m*, and the high frequency dielectric constant (contribution from the valence electrons) $\varepsilon\infty$ are required. $\varepsilon\infty$ and m* are well established in literature. N and $\tau$ are determined from Hall effect measurements by relating $\tau = \mu m^*/q$ to the mobility $\mu$, with the electron charge q. The Drude model then gives the dc conductivity $\sigma_0 = N q \mu$, and the relative material permittivity:

$$\varepsilon = \varepsilon_\infty(\omega) + \frac{i}{\omega \varepsilon_0} \frac{\sigma_0}{1 - i\omega\mu m^*/q}$$

The complex index of refraction according to the Drude model is given by $\tilde{n} = n + ik = \sqrt{\varepsilon}$, where $\varepsilon_0$ is the permittivity of free space. In the longwave/low frequency limit, the absorption coefficient $$\alpha = \frac{4\pi k}{\lambda}$$

with wavelength $\lambda$, depends on material properties such as $$\alpha \propto \frac{N\lambda^2}{\mu m^{*2}}.$$

As can be seen in FIG. 2, however, the predictions of the Drude model 200 do not fit well with measured data 202. Instead, it can be seen in the FIG. that the measured absorption 202 as a function of layer thickness and at a wavelength of 8 microns fit well with the Nag model 100 of the present disclosure for sheet resistances of 2.5 Ω/sq, 5 Ω/sq, and 10 Ω/sq.

Figure 3:
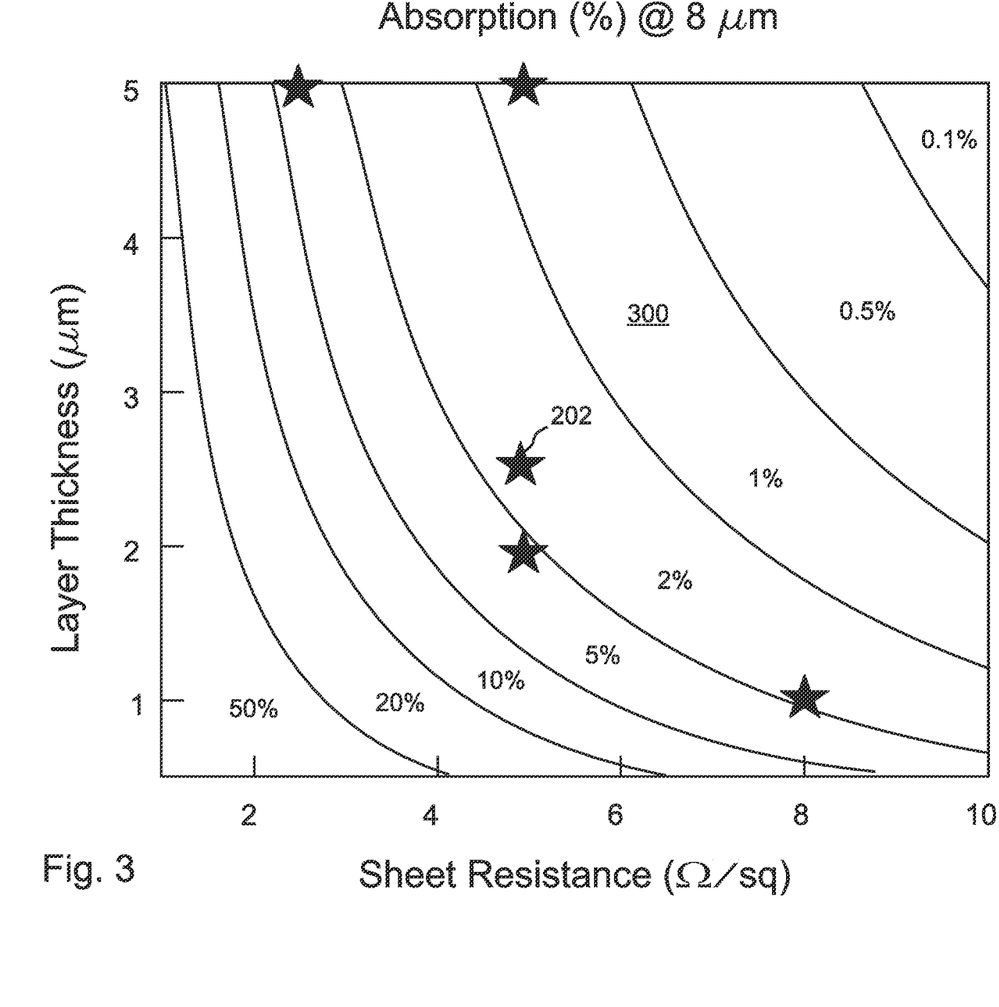
FIG. 3 is a graph comparing measured values of doped GaAs layers with predictions of the model included in the present disclosure, where sheet resistance is represented on the horizontal axis, layer thickness is represented on the vertical axis, and the percent absorption at 8 microns wavelength is indicated by the curved lines that separate approximate "bands" of absorption.

FIG. 3 illustrates a range of parameters that are accessible according to the present disclosure. Note, however, that the present disclosure is not limited to only the parameter ranges presented in the figure. The figure is essentially three-dimensional, with the sheet resistance presented on the horizontal axis, the layer thickness on the vertical axis, and the percent absorption at 8 microns wavelength indicated by the curved lines that separate approximate "bands" 300 of 0.1%, 0.5%, 1%, 2%, 5%, 10%, 20% and 50% absorption. Obviously, the absorption will vary continuously across the graph, with the indicated percentages being approximate averages for the spaces 300 between the curved lines. The stars 202 in the figure represent actual measured values at 8 microns.

Figure 4:
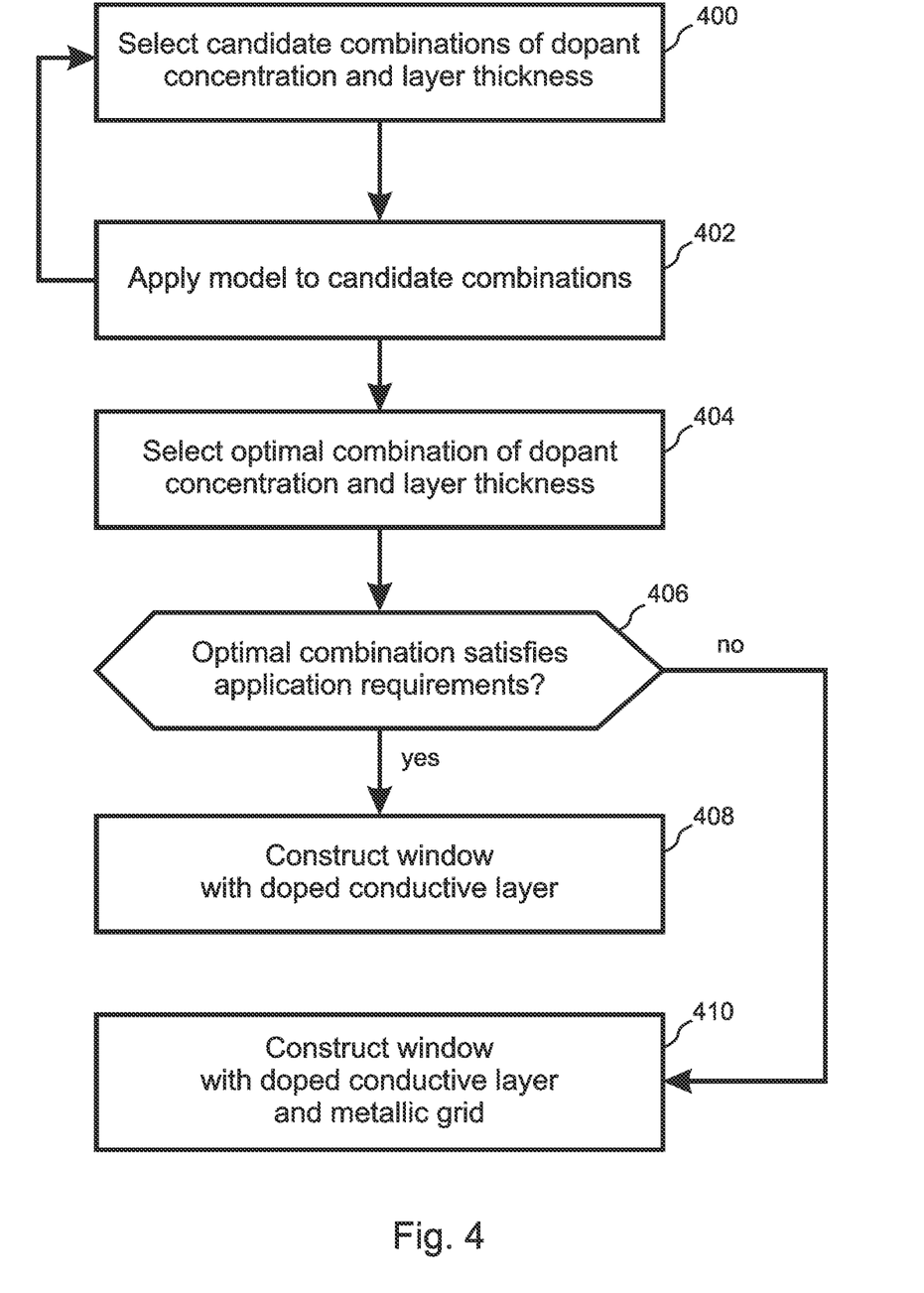
FIG. 4 is a flow diagram illustrating an embodiment of the present disclosure.

With reference to FIG. 4, according to the present disclosure a plurality of candidate combinations of dopant concentration values and layer thickness values are selected 400, and the model as presented herein is applied thereto 402. Depending on the model predictions for the initially considered combinations of parameter values, additional candidate combinations can be selected 400 and the model applied thereto 402. This process is repeated until an optimal parameter combination is determined 404 according to the requirements of a specific application.

If the model indicates that the requirements of an application will be met by the optimal combination of parameters 406, then the window slab is manufactured and the optimal conductive layer applied thereto 408 as specified by the model.

If, however, the model indicates that the requirements of the application will not be satisfied 406 even for the optimal choice of layer thickness and dopant concentration, then, in embodiments, a window is constructed by applying a doped layer to a slab for which the optical transparency exceeds the transparency requirement by some margin, even if the EMI shielding is not sufficient. In addition, a metallic grid layer is applied to the window to improve its EMI shielding 410. While the metallic grid results in some loss of transparency, sufficient transparency is maintained due to the margin provided by the doped layer, thereby meeting all requirements of the application.

Due to the inverse dependence of skin depth on conductivity, the EMI shielding that is provided by a doped semiconductor layer will be strongest at the higher end of the EMI frequency range. In contrast, for a metallic grid having a given grid spacing, the EMI shielding will be strongest at the lower end of the EMI frequency range. Accordingly, for embodiments that include a metallic grid layer in addition to the doped semiconductor layer 410, the metallic grid will be significantly thinner and more widely spaced than would be required if the EMI shielding depended entirely on the metallic grid. As a result, any loss of transparency and optical artifacts introduced by the metallic grid are minimized.

Embodiments further include applying an anti-reflective (AR) coating to the window on top of the conductive coating. In some of these embodiments, the Drude conductivity-based model is used to estimate the real part of the index of refraction of the doped GaAs or GaP layer, thereby providing a starting point for selecting a compatible AR coating material. While the Drude model was found to be a poor approximation of the IR absorption vs. sheet resistance for a conductive layer, the predictions according to the Drude model of the real part of the index of refraction of the doped layer corresponded well enough with measured values to provide a helpful starting point for determining an optimal AR coating material.

In embodiments, for GaAs windows, the single crystal GaAs slab is grown using hydride vapor phase epitaxy (HVPE) rather than by vertical melt, thereby significantly improving the transparency of the GaAs, especially at wavelengths near 1 micron. In embodiments, the GaAs slab is grown using low-pressure HVPE (LP-HVPE) to obtain a maximum growth rate that is comparable to the growth rates of GaAs boules.

Figure 5:
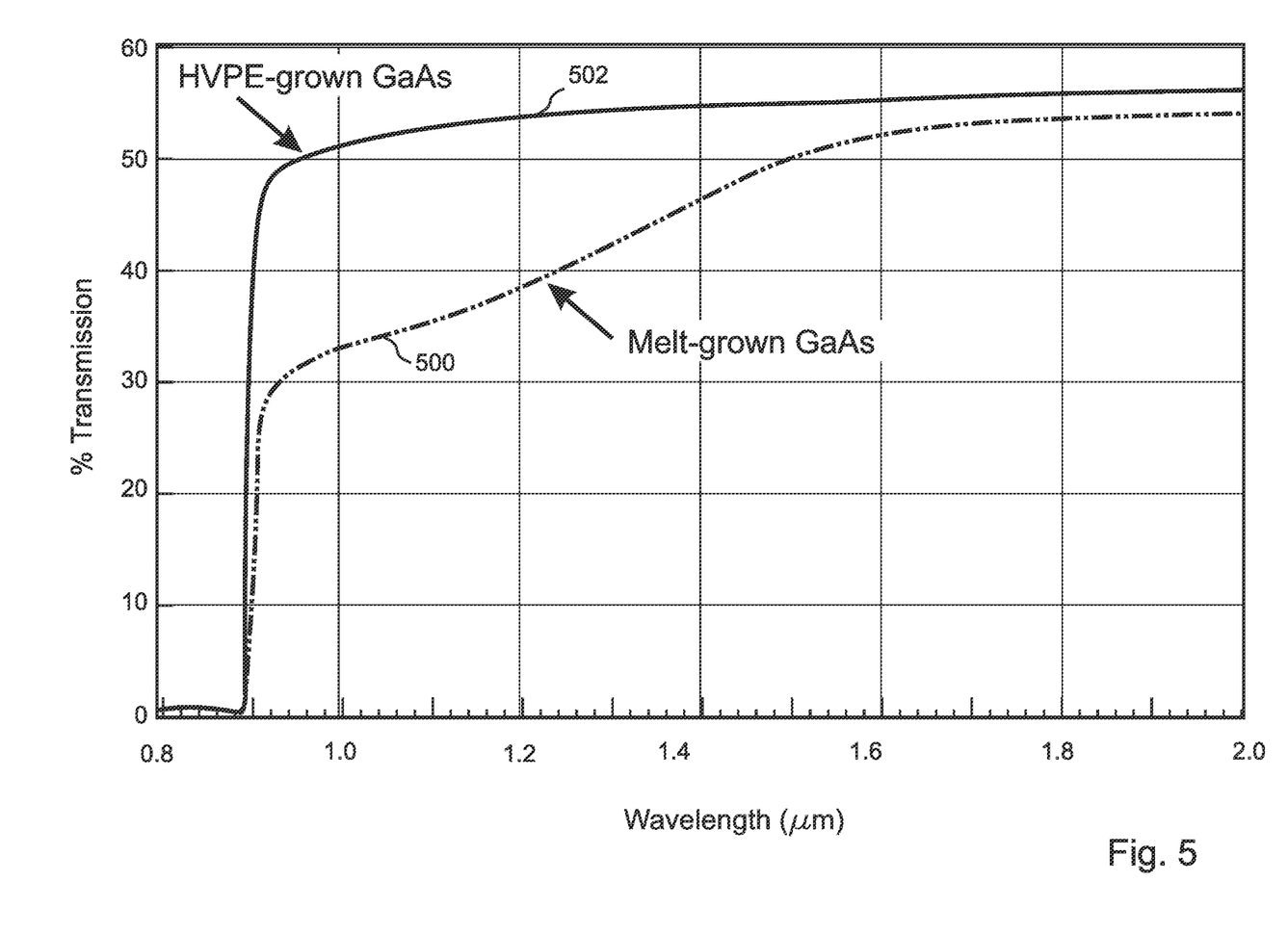
FIG. 5 is a graph comparing the very high spectral transmission of GaAs grown by HVPE compared to the much lower transmission of typical commercial melt-grown GaAs, which exhibits high losses near 1 micron.

With reference to FIG. 5, HVPE-grown GaAs windows 502 typically exhibit significantly lower absorption than melt-grown "commercial off-the-shelf" (COTS) crystals 500. In part, this is because GaAs grown using HVPE exhibits a greatly reduced concentration of impurities due to the use of ultra-high purity gas phase precursors. More importantly, native defects are reduced because the reduced growth temperatures of HVPE limit the solubility of excess arsenic that manifests itself as arsenic-on-gallium anti-sites. It is these so-called "EL2" defects that tend to cause high absorption losses in conventional, melt-grown GaAs windows at wavelengths near one micron. In the illustrated example, a wafer approximately 1 mm thick grown vertically from melt and sliced from a boule transmits less than 35% at one micron, whereas a layer of similar doping and thickness grown by LP-HVPE transmits more than 50% at the same wavelength.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. A method of designing and manufacturing an EMI shielded infrared (IR) window suitable for a specified application having specified size, transparency, and EMI shielding requirements, the method comprising:
    preparing a slab of GaAs or GaP according to the size requirement of the specified application, the slab having sufficient thickness to meet a structural competence requirement of the specified application;
    selecting a plurality of candidate parameter combinations comprising combinations of candidate dopant concentrations and candidate layer thicknesses for a doped conductive layer to be applied to the slab, the doped layer being a doped layer of GaAs if the slab is a GaAs slab, the doped layer being a doped layer of GaP if the slab is a GaP slab;
    applying a model to the candidate parameter combinations, thereby for each of the candidate parameter combinations estimating an IR absorption and a sheet conductivity of the doped conductive layer, wherein applying the model comprises:
        applying an empirical low field mobility model according to Sotoodeh, thereby estimating a carrier mobility of the doped conductive layer;
        calculating an estimated sheet resistance of the doped conductive layer according to the candidate parameters and the estimated carrier mobility; and
        applying a quantum mechanical defect scattering model of free carrier absorption based upon a relationship taught by Nag, thereby estimating the IR absorption of the doped conductive layer according to the candidate layer thickness and the estimated sheet resistance of the doped conductive layer;
    repeating the steps of selecting candidate parameters and applying the model thereto until an optimal combination of layer thickness and dopant concentration are determined; and
    if the model predicts that applying the doped semiconductor layer having the determined optimal combination of layer thickness and dopant concentration will meet the transparency and EMI shielding requirements of the specified application, applying the doped conductive layer to the slab according to the determined optimal combination of layer thickness and dopant concentration.

2. The method of claim 1, wherein the doped conductive layer is applied to the slab by a vacuum deposition process.

3. The method of claim 1, wherein the doped conductive layer is applied to the slab by hydride vapor phase epitaxy (HVPE).

4. The method of claim 3, wherein the doped conductive layer is applied to the slab by low pressure HVPE (LP-HVPE).

5. The method of claim 1, further comprising applying an anti-reflective (AR) coating onto the doped conductive layer.

6. The method of claim 5, wherein the method further comprises:
    applying a Drude model to estimate a real part of an index of refraction of the doped conductive layer; and
    selecting the AR coating at least in part according to the estimated real part of the index of refraction of the doped conductive layer.

7. The method of claim 1, wherein the slab is a GaAs slab, and preparing the slab includes growing the GaAs slab using HPVE.

8. The method of claim 7, wherein preparing the slab includes growing the GaAs slab using LP-HPVE.

9. The method of claim 7, wherein the doped conductive layer is applied to the slab as part of the HVPE process that is used to grow the slab.

10. The method of claim 1, wherein the method further comprises, if the model predicts that applying the doped semiconductor layer having the determined optimal combination of layer thickness and dopant concentration will not meet the transparency and EMI shielding requirements of the specified application:
    applying the doped conductive layer to the slab with a combination of layer thickness and dopant concentration that exceeds the transparency requirement of the application; and
    applying a metallic grid to the slab having a thickness and grid spacing sufficient to cause the combined metallic grid and doped semiconductor EMI shielding to meet both of the transparency and EMI shielding requirements of the specified application.

* * * * *